(12) United States Patent
Lai et al.

(10) Patent No.: US 9,405,063 B2
(45) Date of Patent: Aug. 2, 2016

(54) INTEGRATED METAL GRATING

(71) Applicant: Taiwan Semiconductor Manufacturing Company, Ltd., Hsin-Chu (TW)

(72) Inventors: Jui Hsieh Lai, Taoyuan (TW); Tien-I Bao, Dayuan Township (TW); Hai-Ching Chen, Hsin-Chu (TW); Ying-Hao Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 277 days.

(21) Appl. No.: 13/915,300

(22) Filed: Jun. 11, 2013

(65) Prior Publication Data

US 2014/0363121 A1 Dec. 11, 2014

(51) Int. Cl.
| | |
|---|---|
| *G02B 6/124* | (2006.01) |
| *G02B 6/34* | (2006.01) |
| *G02B 6/12* | (2006.01) |
| *H01L 31/0203* | (2014.01) |
| *G02B 6/42* | (2006.01) |

(52) U.S. Cl.
CPC ............ *G02B 6/12002* (2013.01); *G02B 6/124* (2013.01); *G02B 6/12004* (2013.01); *G02B 6/34* (2013.01); *H01L 31/0203* (2013.01); *G02B 6/428* (2013.01); *G02B 2006/12085* (2013.01); *G02B 2006/12107* (2013.01); *G02B 2006/12123* (2013.01); *Y10T 29/49826* (2015.01)

(58) Field of Classification Search
None
See application file for complete search history.

(56) References Cited

U.S. PATENT DOCUMENTS

| | | | | |
|---|---|---|---|---|
| 6,343,171 | B1 * | 1/2002 | Yoshimura et al. | ............. 385/50 |
| 2004/0240788 | A1 * | 12/2004 | Zheng | ...................... G02B 6/42 385/37 |
| 2006/0104564 | A1 * | 5/2006 | Catrysse | ........... H01L 27/14623 385/14 |
| 2009/0003762 | A1 * | 1/2009 | Chiniwalla | .......... G02B 6/1228 385/14 |

OTHER PUBLICATIONS

Mekis, Attila et al., "A Grating-Coupler-Enabled CMOS Photonics Platform," IEEE Journal of Selected Topics in Quantum Electronics vol. 17, No. 3, pp. 597-608, May/Jun. 2011.

* cited by examiner

*Primary Examiner* — Michelle R Connelly
(74) *Attorney, Agent, or Firm* — Slater Matsil, LLP

(57) ABSTRACT

An integrated circuit includes a substrate, a metal grating disposed over the substrate, and a waveguide layer disposed over or under the metal grating. The metal grating is arranged to change a propagation direction of an optical signal and the waveguide layer is arranged to guide the optical signal to a desired direction.

20 Claims, 6 Drawing Sheets

INTEGRATED METAL GRATING

TECHNICAL FIELD

The present disclosure relates generally to an integrated circuit and more particularly to an integrated metal grating.

BACKGROUND

For a higher data speed and a larger data capacity, optical interconnection provides a solution for mass data transfer. Conventional grating coupler is an individual optical device in the bench or at a package level. The size is still relatively large for an integrated system.

BRIEF DESCRIPTION OF THE DRAWINGS

Reference is now made to the following descriptions taken in conjunction with the accompanying drawings, in which.

DETAILED DESCRIPTION

Figure 1A:
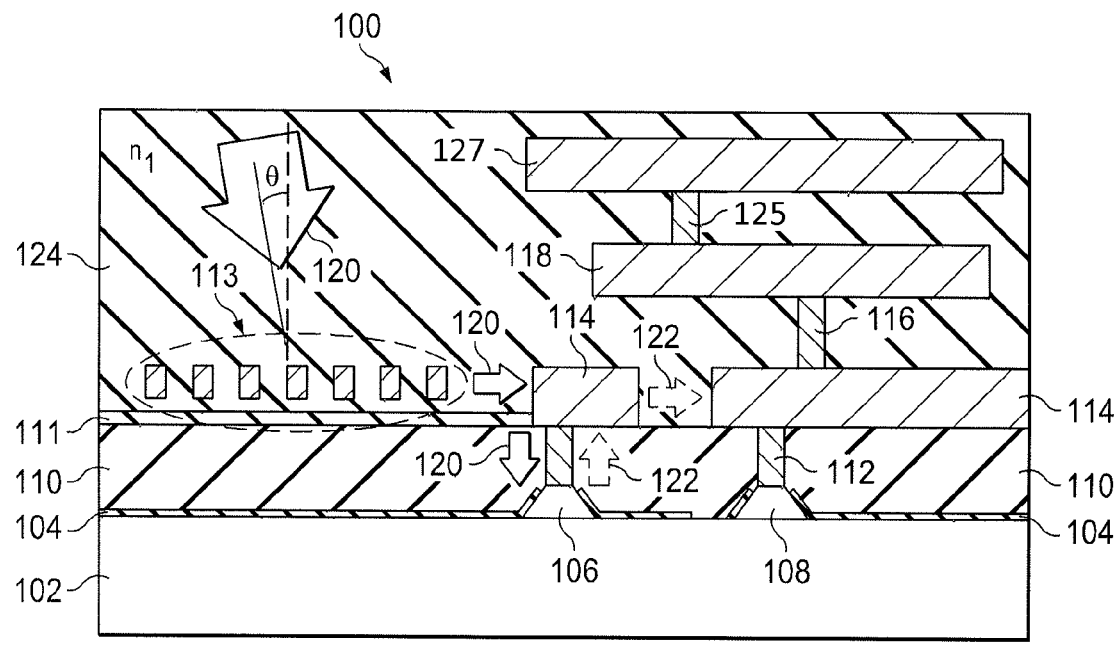
FIG. 1A is a cross section view of an exemplary integrated circuit including a metal grating according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a cross section view of an exemplary integrated circuit 100 including a metal grating 113 according to some embodiments. The integrated circuit 100 includes a substrate 102, a passivation layer 104, a photo detector 106, another device 108 such as a transistor, dielectric layers 110 and 124, a waveguide layer 111, the metal grating 113, metal layers 114, 118, and 127, and vias 112, 116, and 125.

The substrate 102 can comprise silicon, silicon dioxide, aluminum oxide, sapphire, germanium, gallium arsenide (GaAs), an alloy of silicon and germanium, indium phosphide (InP), silicon on insulator (SOI), or any other suitable material. The photo detector 106 can be a SiGe detector, or any other suitable device (e.g., a p-n junction photodiode) for detecting incident optical signal light. The device 108 can be a transistor, a SiGe optical component such as a modulator, or any other device. The optical signal has a wavelength ranging from 600 nm to 1600 nm in some applications. The passivation layer 104 comprises silicon nitride, silicon dioxide, or any other suitable material.

The dielectric layers 110 and 124 can be an inter-layer dielectric (ILD) comprising a low-k dielectric material or any other suitable material. The metal layers 114, 118, and 127, and the vias 112, 116, and 125 comprise electrically conductive material, such as copper, aluminum, or any other suitable material. The thickness of the metal layers and the via layers is dependent on the design and process, and it can be less than 500 nm in some embodiments.

The arrows 120 indicate the propagation direction of the optical signal and the arrows 122 indicate the propagation direction of the electrical signal in some embodiments. As the incident optical signal light propagates at angle $\theta$ with respect to the vertical axis from the top of the dielectric layer 124, the grating 113 changes the direction and the waveguide layer 111 guides the optical signal light towards the photo detector 106. The electrical signal generated by the photo detector 106 from the optical signal can be sent through the via 112 and the metal layer 114 interconnection to a desired part of the integrated circuit 100.

The waveguide layer 111 comprises silicon nitride with a thickness ranging from 20 nm to 300 nm in some embodiments. The metal grating 113 may be formed directly on the waveguide layer 111, or have some spacing therebetween. In some embodiments, the spacing between the metal grating 113 and the waveguide layer 111 can be 500 nm or less.

The metal grating 113 is formed in a metal layer 114 with a thickness ranging from 20 nm to 200 nm in some embodiments. The metal grating 113 comprises copper, aluminum, or any other suitable material. In some embodiments, the metal has a relatively high refractive index (RI) compared to the dielectric layer 124 that has a refractive index (RI) of about 1.5. In some embodiments, the RI of the metal can be greater than 7.

In some embodiments, the metal grating 113 has a pitch ranging from 20 nm to 800 nm. In some embodiments, the pitch of the metal grating 113 is greater than the critical dimension (CD) of the process and the CD is 30% of the pitch. In some embodiments, the grating pitch of the metal grating 113 increases with the angle $\theta$, and the optical signal wavelength increases with the grating pitch.

The metal grating 113 formed in the metal layer 114 allows one to integrate and to fabricate the embedded metal grating within the Complementary Metal-Oxide-Semiconductor (CMOS) backend process to make the optical data transfer possible at the System-on-Chip (SOC) level. It can also reduce the optical integration dimension of a passive optical signal channel using the optical coupler such as the metal grating 113 to the chip level.

Figure 1B:
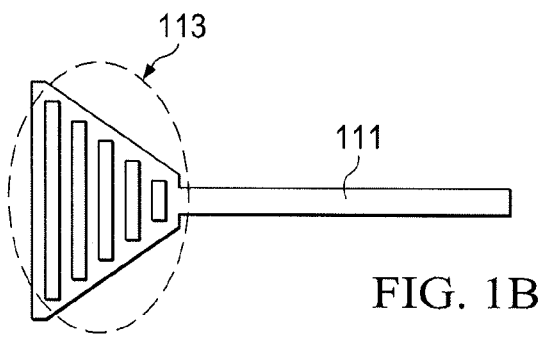
FIGS. 1B-1C are top views of a portion of the exemplary integrated circuit including the metal grating in FIG. 1A according to some embodiments.
Figure 1C:
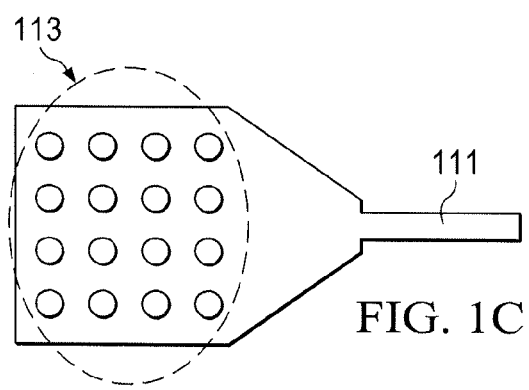

FIGS. 1B-1C are top views of a portion of the exemplary integrated circuit 100 including the metal grating 113 in FIG. 1A according to some embodiments. In FIG. 1B, the metal grating 113 and the waveguide layer 111 have a triangular shape for coupling the optical signal on the wide left side that narrows towards the right side. In FIG. 1C, the metal grating 113 and the waveguide layer 111 have a rectangular array shape for coupling the optical signal on the wide left side that narrows towards the right side.

Figure 2:
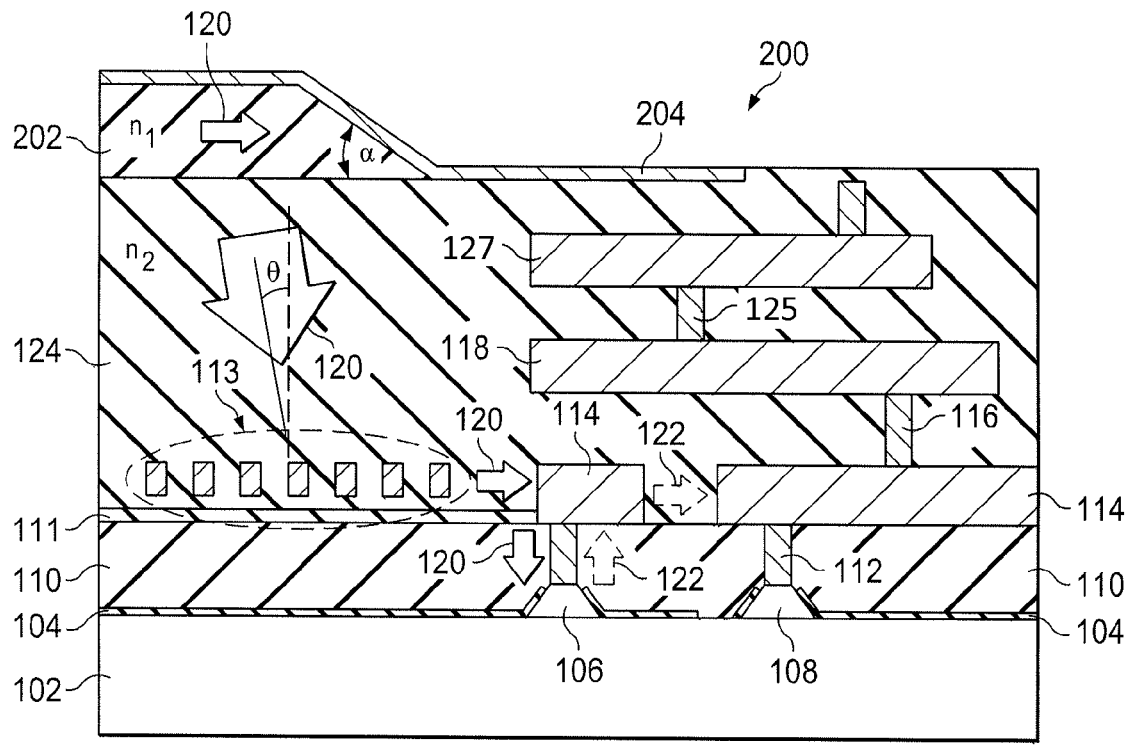
FIG. 2 is a cross section view of another exemplary integrated circuit including a metal grating according to some embodiments.

FIG. 2 is a cross section view of another exemplary integrated circuit 200 including a metal grating 113 according to some embodiments. The integrated circuit 200 is similar to the integrated circuit 100 except that another dielectric layer 202 is formed over the dielectric layer 124 and a reflector layer 204 is formed over the dielectric layer 202 with a slope at an angle α. The dielectric layer 202 comprises polyimide (PI) or any other suitable material. The reflector layer 204 comprises metal such as copper, aluminum, or any other suitable material.

The optical signal propagation direction is shown with arrows 120. The incident optical signal light propagates in a horizontal direction in the dielectric layer 202. Then the optical signal light is reflected by the reflector layer 204 and propagates at the angle θ in the dielectric layer 124 by taking advantage of the different indexes of reflection for layers 202 and 124. Assuming the RI of the dielectric layer 202 is $n_1$, the RI of the dielectric layer 124 is $n_2$, the angle α can be expressed by the following equation:

$$\alpha = \frac{90 - \sin^{-1}\left(\left(\frac{n2}{n1}\right)\sin\theta\right)}{2}. \quad \text{Eq. (1)}$$

The angle α can be between 20° and 90° in some embodiments.

FIGS. 3A-3E are intermediate fabrication steps of the exemplary integrated circuit 100 including the metal grating 113 in FIG. 1A according to some embodiments. In this exemplary method, the waveguide layer 111 is formed before the metal grating 113 is formed.

Figure 3A:
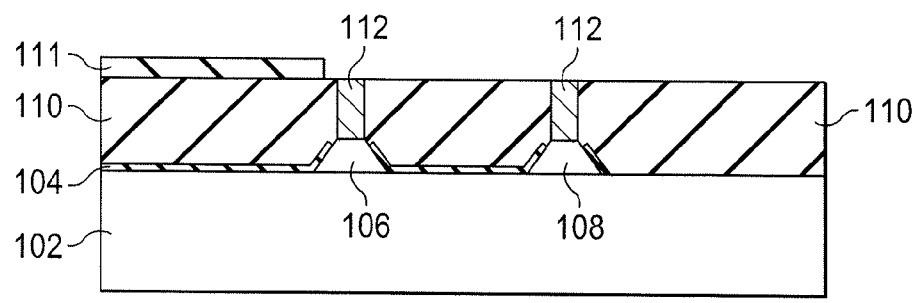
FIGS. 3A-3E are intermediate fabrication steps of the exemplary integrated circuit including the metal grating in FIG. 1A according to some embodiments.

In FIG. 3A, the waveguide layer 111, e.g., silicon nitride, is formed over the dielectric layer 110 (and/or the via 112 layer) by chemical vapor deposition (CVD), photolithography, and etching, for example.

Figure 3B:
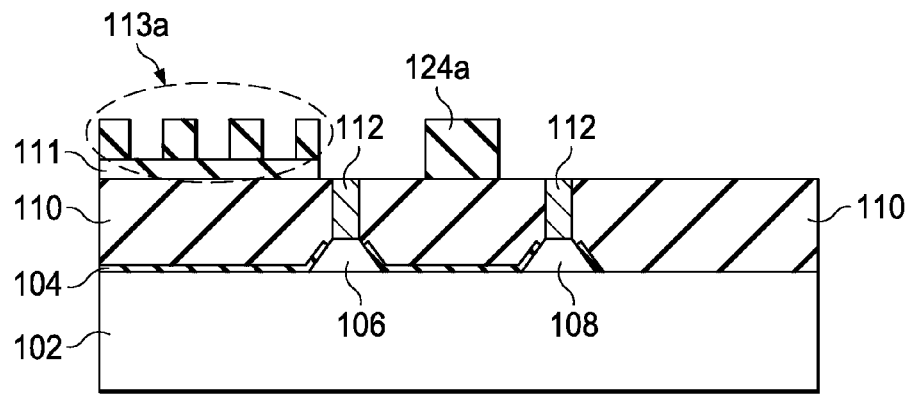

In FIG. 3B, the dielectric layer 124a (the lower portion of 124 in FIG. 1A) is formed by CVD or spin-on deposition, photolithography, and etching process, for example. In some embodiments, the dielectric layer 124a comprises a low-k dielectric material. The metal grating area 113a is patterned so that the metal can be deposited according to the metal grating design.

Figure 3C:
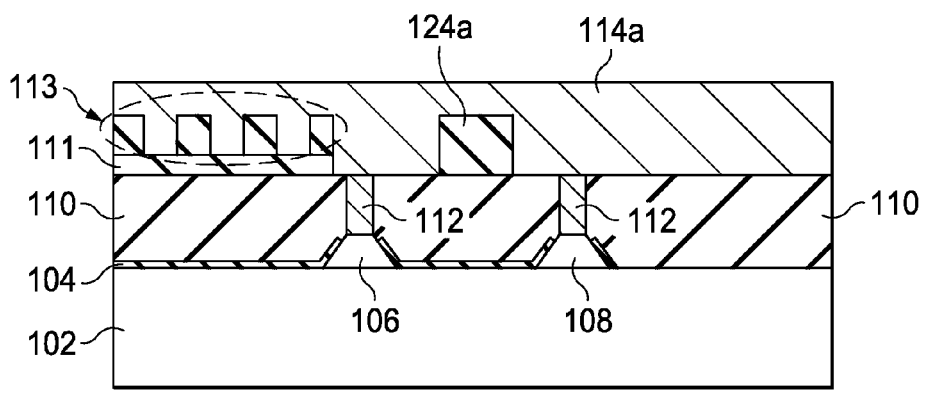

In FIG. 3C, a metal layer 114a is deposited by CVD or plating.

Figure 3D:
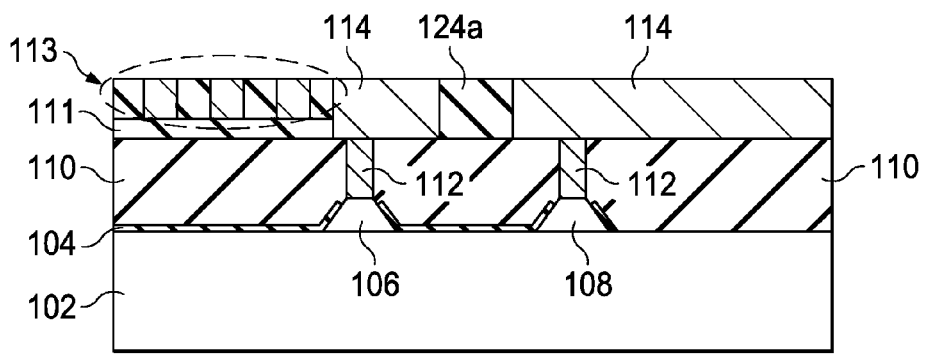

In FIG. 3D, the metal layer 114a is planarized by chemical-mechanical planarization (CMP) to form the metal grating 113 and the metal layer 114. Even though the metal grating 113 is formed in the first metal layer (M1) in this example, it can be formed in any other metal layer or any via layer with similar processes. For example, the metal grating 113 can be formed in M1, M2 or via1 layer in some embodiments.

Figure 3E:
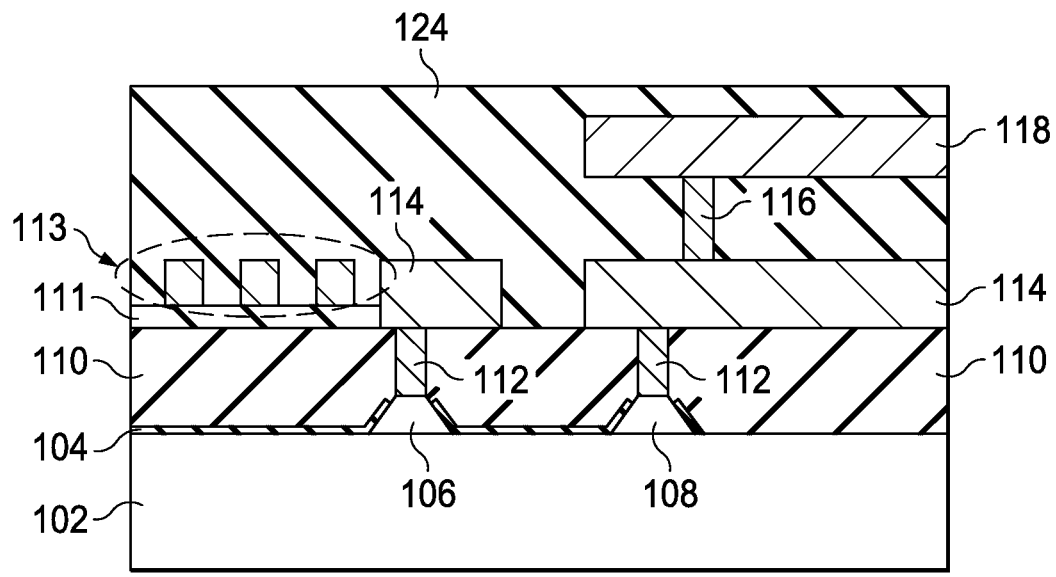

In FIG. 3E, a via layer 116, a metal layer 118, and the dielectric layer 124 can be formed by CVD, plating, etching, CMP, dual damascene, and/or any other suitable processes. In some embodiments, additional via/metal layers may be formed.

Figure 4A:
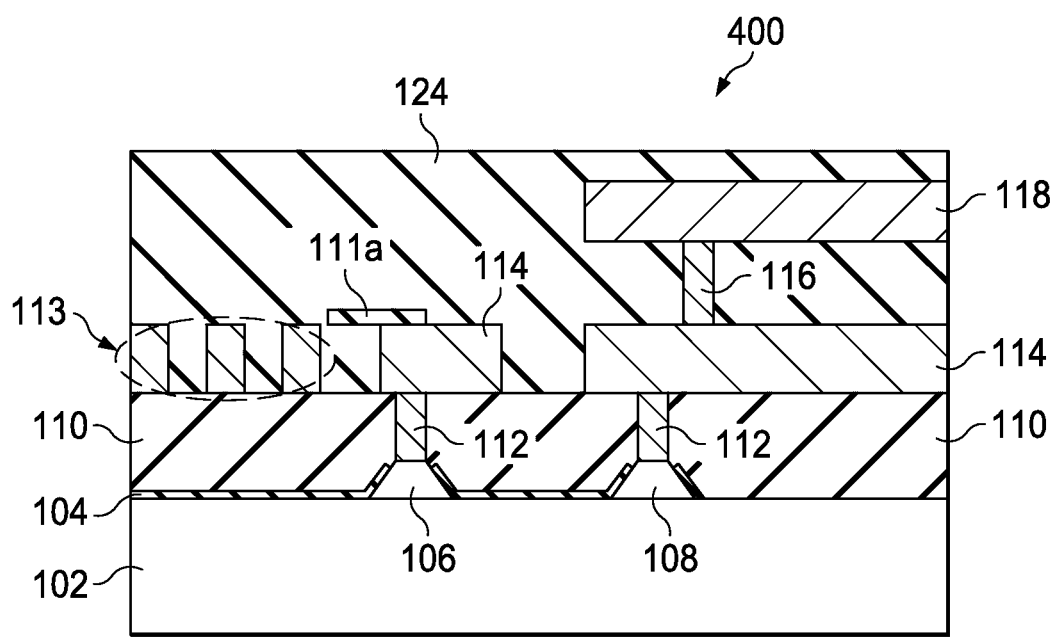
FIG. 4A is a cross section view of another exemplary integrated circuit including a metal grating according to some embodiments.

FIG. 4A is a cross section view of another exemplary integrated circuit 400 including a metal grating 113 according to some embodiments. The integrated circuit 400 is similar to the integrated circuit 100 in FIG. 1A except that the waveguide layer 111a is formed above the metal grating 113 in FIG. 4A. Also, as the optical signal propagates towards the metal grating 113 from above, the waveguide layer 111 a is not directly over the metal grating 113. After the metal grating 113 changes the propagation direction of the incident optical signal light, the waveguide layer 111a guides the optical signal light towards the photo detector 106.

Figure 4B:
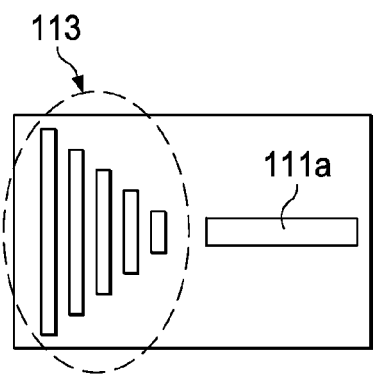
FIG. 4B is a top view of a portion of the exemplary integrated circuit including the metal grating in FIG. 4A according to some embodiments.

FIG. 4B is a top view of a portion of the exemplary integrated circuit 400 including the metal grating 113 in FIG. 4A according to some embodiments. The top view of FIG. 4B is different from the top view of FIG. 1B in that the waveguide layer 111a is not covering the metal grating 113 area. In other embodiments, the waveguide layer 111a may at least partially cover the metal grating 113 area. Even though the waveguide layer 111 in FIG. 1A and 111a in FIG. 4A are shown in separate embodiments, both waveguide layers 111 and 111a can be implemented in one embodiment.

FIGS. 5A-5E are intermediate fabrication steps of the exemplary integrated circuit including the metal grating in FIG. 4A according to some embodiments. In this exemplary method, the waveguide layer 111 is formed after the metal grating 113 is formed.

Figure 5A:
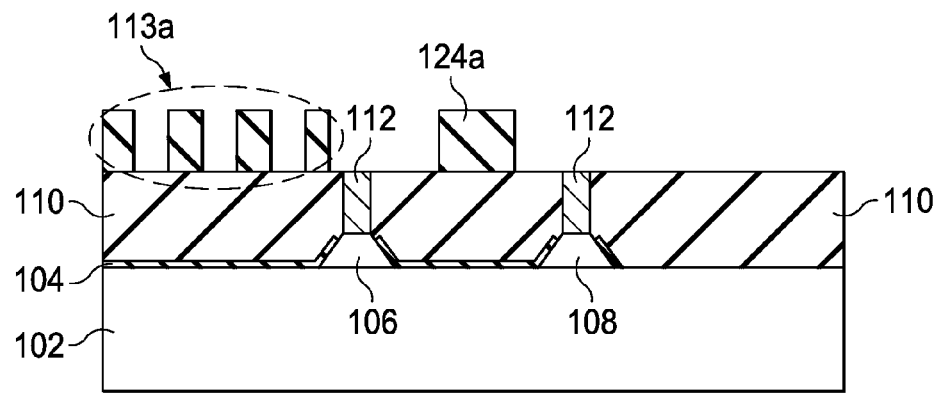
FIGS. 5A-5E are intermediate fabrication steps of the exemplary integrated circuit including the metal grating in FIG. 4A according to some embodiments.

In FIG. 5A, the dielectric layer 124a (the lower portion of 124 in FIG. 1A) is formed over the dielectric layer 110 and the vias 112 by CVD or spin-on deposition, photolithography, and etching process, for example. In some embodiments, the dielectric layer 124a comprises a low-k dielectric material. The metal grating area 113a is patterned so that the metal can be deposited according to the metal grating design.

Figure 5B:
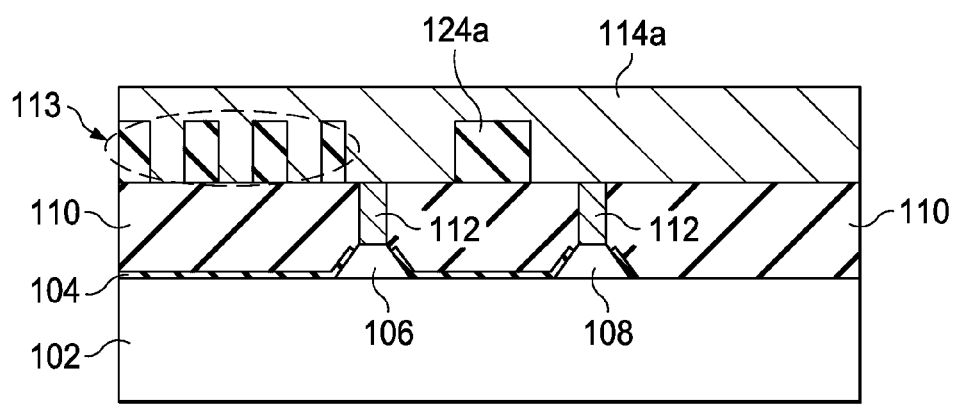

In FIG. 5B, a metal layer 114a is deposited by CVD or plating.

Figure 5C:
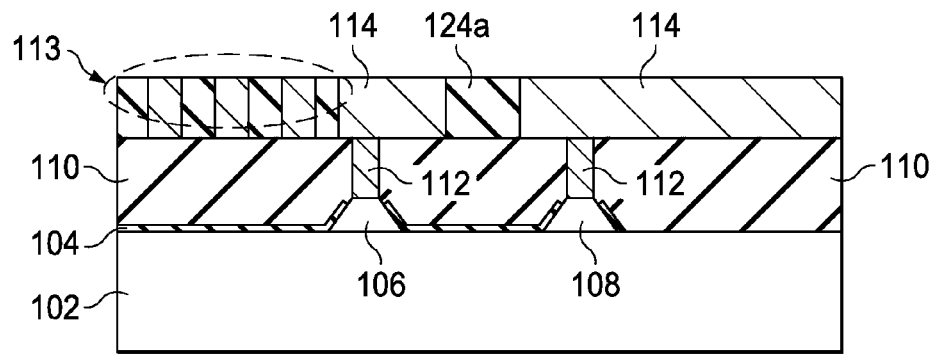

In FIG. 5C, the metal layer 114a is planarized by chemical-mechanical planarization (CMP) to form the metal grating 113 and the metal layer 114. Even though the metal grating 113 is formed in the first metal layer in this example, it can be formed in any other metal layer or any via layer with similar processes. For example, the metal grating 113 can be formed in M1, M2 or vial layer in some embodiments.

Figure 5D:
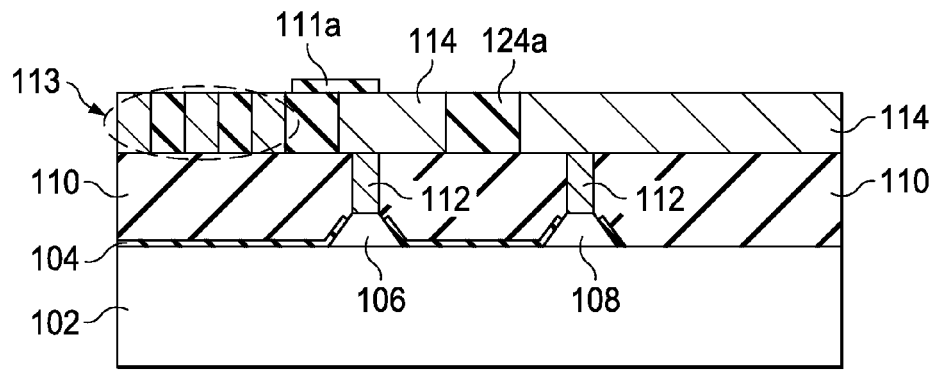

In FIG. 5D, the waveguide layer 111a, e.g., silicon nitride, is formed over the dielectric layer 124a (and/or the metal layer 114) by chemical vapor deposition (CVD), photolithography, and etching, for example. Even though the waveguide layer 111a is not covering the metal grating 113 area in this example, the waveguide layer 111a may at least partially cover the metal grating 113 area in other embodiments.

Figure 5E:
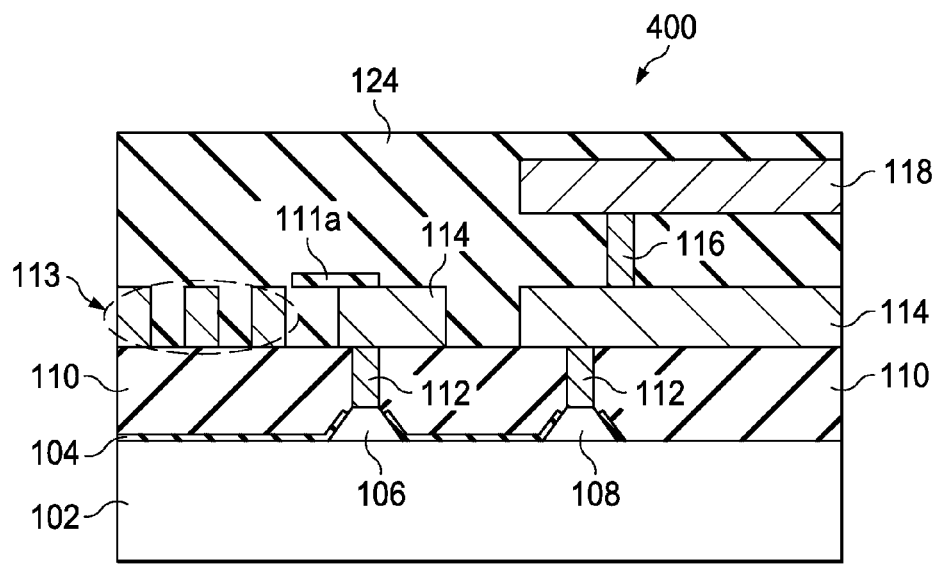

In FIG. 5E, the via layer 116, the metal layer 118, and the dielectric layer 124 are formed by CVD, plating, etching, CMP, dual damascene, and/or any other suitable processes. In some embodiments, additional via/metal layers may be added as necessary.

Even though the waveguide layer 111a in FIG. 5D and 111 in FIG. 3A are shown in separate embodiments, both waveguide layers 111 and 111a can be combined and fabricated in one embodiment using similar processes described herein.

According to some embodiments, an integrated circuit includes a substrate, a metal grating disposed over the substrate, and a waveguide layer disposed over or under the metal grating. The metal grating is arranged to change a propagation direction of an optical signal and the waveguide layer is arranged to guide the optical signal to a desired direction.

According to some embodiments, an integrated circuit includes a substrate, a metal grating disposed over the substrate, a waveguide layer disposed over or under the metal grating, a first dielectric layer disposed over the metal grating, a second dielectric layer disposed over the first dielectric layer, and a reflector layer over the second dielectric layer. The reflector layer is arranged to reflect an optical signal in the second dielectric layer towards the first dielectric layer. The metal grating is arranged to change a propagation direction of the optical signal in the first dielectric layer. The waveguide layer is arranged to guide the optical signal to a desired direction.

According to some embodiments, a method includes forming a metal grating over a substrate. The metal grating is arranged to change a propagation direction of an optical signal. A waveguide layer is formed over or under the metal grating. The waveguide layer is arranged to guide the optical signal to a desired direction.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit, comprising:
a metal grating disposed over a substrate;
at least a first waveguide layer disposed over or under the metal grating;
a metallization layer disposed over the substrate; and
a photo detector disposed under the metallization layer;
wherein:
the metal grating is arranged to change a propagation direction of an optical signal;
the first waveguide layer is arranged to guide the optical signal towards the photo detector; and
the metallization layer comprises an extending portion that extends over at least a portion of the photo detector, the extending portion of the metallization layer adapted to convey an electrical signal generated by the photo detector.

2. The integrated circuit of claim 1, further comprising a first dielectric layer disposed over the substrate and below the metal grating.

3. The integrated circuit of claim 2, further comprising at least one via in the first dielectric layer.

4. The integrated circuit of claim 2, further comprising a second dielectric layer disposed over the metal grating.

5. The integrated circuit of claim 1, further comprising a passivation layer over the substrate and below the first waveguide layer.

6. The integrated circuit of claim 1, wherein the metal grating comprises copper or aluminum.

7. The integrated circuit of claim 1, wherein the metal grating has a thickness ranging from 20 nm to 200 nm.

8. The integrated circuit of claim 1, wherein the metal grating has a pitch ranging from 20 nm to 800 nm.

9. The integrated circuit of claim 1, wherein the first waveguide layer comprises silicon nitride.

10. The integrated circuit of claim 1, wherein the first waveguide layer has a thickness ranging from 20 nm to 300 nm.

11. The integrated circuit of claim 1, wherein the first waveguide layer is disposed under the metal grating and a second waveguide layer is disposed over the metal grating.

12. An integrated circuit, comprising:
a metal grating disposed over a substrate;
at least a first waveguide layer disposed over or under the metal grating;
a metallization layer disposed over the substrate;
a photo detector disposed under the metallization layer;
a first dielectric layer disposed over the metal grating;
a second dielectric layer disposed over the first dielectric layer; and
a reflector layer over the second dielectric layer;
wherein:
the reflector layer is arranged to reflect an optical signal in the second dielectric layer towards the first dielectric layer;
the metal grating is arranged to change a propagation direction of the optical signal in the first dielectric layer;
the first waveguide layer is arranged to guide the optical signal under the metallization layer towards the photo detector; and
at least a portion of the metallization layer extends over the photo detector.

13. The integrated circuit of claim 12, wherein the first waveguide layer is disposed under the metal grating and a second waveguide layer is disposed over the metal grating.

14. A method, comprising:
forming a metal grating over a substrate, the metal grating at a first level above a second level, wherein the metal grating is arranged to change a propagation direction of an optical signal;
forming a photo detector at the second level; and
forming at least a first waveguide layer over or under the metal grating, wherein the first waveguide layer is arranged to guide the optical signal towards the photo detector;
wherein:
the substrate has a major surface; and
the metal grating is wholly spaced apart from the photo detector in a lateral direction substantially parallel to the major surface of the substrate.

15. The method of claim 14, further comprising forming a first dielectric layer over the substrate and below the metal grating.

16. The method of claim 15, further comprising forming at least one via in the first dielectric layer.

17. The method of claim 15, further comprising forming a second dielectric layer over the metal grating.

18. The method of claim 14, further comprising forming a passivation layer over the substrate and below the first waveguide layer.

19. The method of claim 14, wherein the metal grating comprises copper or aluminum and the first waveguide layer comprises silicon nitride.

20. The method of claim 14, where the first waveguide layer is formed under the metal granting and a second waveguide layer is formed over the metal grating.

* * * * *